United States Patent
Chih et al.

(10) Patent No.: US 9,767,878 B1
(45) Date of Patent: Sep. 19, 2017

(54) SEMICONDUCTOR MEMORY DEVICE AND METHOD FOR CONTROLLING THE SAME

(71) Applicant: TAIWAN SEMICONDUCTOR MANUFACTURING COMPANY LTD., Hsinchu (TW)

(72) Inventors: Yu-Der Chih, Hsin-Chu (TW); Tien-Wei Chiang, Taipei (TW); Chun-Jung Lin, Hsinchu (TW); Harry-Hak-Lay Chuang, Paya Lebar Crescent (SG); William J. Gallagher, Hsinchu (TW)

(73) Assignee: TAIWAN SEMICONDUCTOR MANUFACTURING COMPANT LTD., Hsinchu (TW)

( * ) Notice: Subject to any disclaimer, the term of this patent is extended or adjusted under 35 U.S.C. 154(b) by 0 days.

(21) Appl. No.: 15/174,614

(22) Filed: Jun. 6, 2016

Related U.S. Application Data

(60) Provisional application No. 62/313,570, filed on Mar. 25, 2016.

(51) Int. Cl.
*G11C 11/00* (2006.01)
*G11C 11/16* (2006.01)
*H01L 43/10* (2006.01)
*H01L 43/08* (2006.01)

(52) U.S. Cl.
CPC .......... *G11C 11/1675* (2013.01); *G11C 11/16* (2013.01); *G11C 11/161* (2013.01); *G11C 11/1673* (2013.01); *H01L 43/08* (2013.01); *H01L 43/10* (2013.01)

(58) Field of Classification Search
CPC . G11C 11/1675; G11C 11/1673; G11C 11/16; G11C 11/161; H01L 43/10; H01L 43/08
See application file for complete search history.

(56) References Cited

U.S. PATENT DOCUMENTS

| | | | |
|---|---|---|---|
| 2004/0032777 A1* | 2/2004 | Perner | G11C 7/1006 365/209 |
| 2008/0197431 A1* | 8/2008 | Morise | B82Y 10/00 257/421 |
| 2013/0212431 A1* | 8/2013 | Ong | G06F 15/167 714/15 |
| 2014/0157065 A1* | 6/2014 | Ong | G11C 29/12 714/718 |

* cited by examiner

*Primary Examiner* — Toan Le
(74) *Attorney, Agent, or Firm* — WPAT, P.C., Intellectual Property Attorneys; Anthony King

(57) ABSTRACT

A method for controlling a magnetic memory device is provided. The method includes: applying a first control signal and a second control signal to a ferromagnetic fixed layer and a ferromagnetic free layer of the magnetic memory device respectively, wherein a first voltage level of the first control signal is lower than a second voltage level of the second control signal; sensing a first current signal flowing through the magnetic memory device; and determining a logical state of a first data bit according to the first current signal.

20 Claims, 8 Drawing Sheets

SEMICONDUCTOR MEMORY DEVICE AND METHOD FOR CONTROLLING THE SAME

CROSS-REFERENCE TO RELATED APPLICATION

This application claims the benefit of U.S. Provisional Application No. 62/313,570, filed Mar. 25, 2016.

BACKGROUND

Semiconductors are used in integrated circuits for electronic applications, including radios, televisions, cell phones, and personal computing devices. One type of well-known semiconductor devices is semiconductor storage device, such as dynamic random access memories (DRAMs) and flash memories, both of which use charges to store information. A more recent development in semiconductor memory devices involves spin electronics, which combines semiconductor technology and magnetic materials and devices. The spin polarization of electrons, rather than the charge of the electrons, is used to indicate the state of "1" or "0". One such spin electronic device is a spin torque transfer (STT) magnetic tunneling junction (MTJ) device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
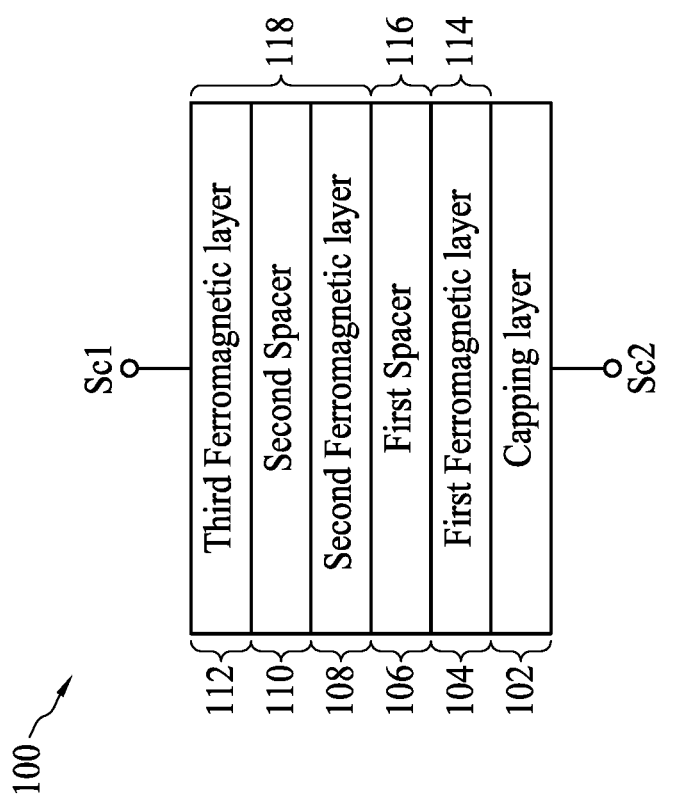
FIG. 1 is a diagram illustrating a magnetic tunneling junction according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embedded magnetoresistive random access memory (MRAM) cell in a complementary metal-oxide-semiconductor (CMOS) structure has been continuously developed. A semiconductor memory device with embedded MRAM cells includes an MRAM cell region and a logic region. The MRAM cell region may comprise a plurality of MRAM cells. The logic region may comprise a plurality of conductive lines or metal lines. The plurality of conductive lines may provide routing for the plurality of MRAM cells. The logic region and the MRAM cell region may be disposed in different regions in the semiconductor memory device. For example, the MRAM cell region may be located at the center of the semiconductor memory device while the logic region may be located at a periphery of the semiconductor memory device. However, such an example is not intended to be limiting. Other arrangements of the MRAM cell region and the logic region fall within the contemplated scope of the present disclosure.

In the MRAM cell region, a transistor structure may be disposed under an MRAM structure. In some embodiments, an MRAM cell is embedded in a metallization layer prepared in a back-end-of-line (BEOL) operation. In some embodiments, transistor structures in the MRAM cell region and the logic region are disposed in a same semiconductor substrate and prepared in a front-end-of-line operation, and thus are substantially identical. The MRAM cell can be embedded in any position of the metallization layer, for example, between adjacent metal line layers extending in parallel over the semiconductor substrate. In some embodiments, the embedded MRAM cell can be located between a $4^{th}$ metal line layer and a $5^{th}$ metal line layer in the MRAM cell region. In the logic region, the $4^{th}$ metal line layer is connected to the $5^{th}$ metal line layer though a $4^{th}$ metal via, which is located between the $4^{th}$ metal line layer and the $5^{th}$ metal line layer. In other words, taking the MRAM cell region and the logic region into consideration, an embedded MRAM cell has a thickness of at least a portion of the $5^{th}$ metal line layer and the $4^{th}$ metal via. The architecture of the metal line layers herein is exemplary and not limiting. In general, people having ordinary skill in the art can understand that the MRAM cell is located between an $N^{th}$ metal line layer and an $(N+1)^{th}$ metal line layer, where N is an integer greater than or equal to 1.

The embedded MRAM cell includes a magnetoresitive cell. In some embodiments, the magnetoresitive cell is a magnetic tunneling junction (MTJ) composed of ferromagnetic materials. The MTJ may comprises a ferromagnetic free layer, a tunnel layer, and a ferromagnetic fixed layer. The ferromagnetic free layer and the ferromagnetic fixed layer are electrically coupled to the MTJ for signal/bias conveyance. Following the example previously provided, the ferromagnetic free layer is further connected to the $N^{th}$ metal line layer, whereas the ferromagnetic fixed layer is further connected to the $(N+1)^{th}$ metal line layer.

The magnetization direction of the ferromagnetic free layer can be reversed by applying a current through the tunnel layer, which causes injected polarized electrons within the ferromagnetic free layer to exert spin torques on the magnetization of the ferromagnetic free layer. The ferromagnetic fixed layer has a fixed magnetization direction. When current flows in the direction from the ferromagnetic free layer to the ferromagnetic fixed layer, electrons flow in a reverse direction, that is, from the ferromagnetic fixed layer to the ferromagnetic free layer. The electrons are polarized to the same magnetization direction of the ferromagnetic fixed layer after passing the ferromagnetic fixed layer, flow through the tunnel layer and then into and accumulate in the ferromagnetic free layer. Eventually, the magnetization of the ferromagnetic free layer is parallel to that of the ferromagnetic fixed layer, and the MTJ device will be at a low resistance state. Such electron injection caused by current is referred to as a major injection.

When current flowing from the ferromagnetic fixed layer to the ferromagnetic free layer is applied, electrons flow in the direction from the ferromagnetic free layer to the ferromagnetic fixed layer. Electrons having the same polarization as the magnetization direction of the ferromagnetic fixed layer are able to flow through the tunnel layer and into the ferromagnetic fixed layer. Conversely, electrons with polarization different from the magnetization of the ferromagnetic fixed layer are reflected (blocked) by the ferromagnetic fixed layer and accumulate in the ferromagnetic free layer. Eventually, the magnetization of the ferromagnetic free layer becomes anti-parallel to that of the ferromagnetic fixed layer, and the MTJ device will be at a high resistance state. Such electron injection caused by current is referred to as a minor injection.

FIG. 1 is a diagram illustrating a magnetic tunneling junction (MTJ) 100 according to some embodiments. The MTJ 100 comprises a capping layer 102, a first ferromagnetic layer 104, a first spacer 106, a second ferromagnetic layer 108, a second spacer 110, and a third ferromagnetic layer 112. The capping layer 102, the first ferromagnetic layer 104, the first spacer 106, the second ferromagnetic layer 108, the second spacer 110, and the third ferromagnetic layer 112 are configured to form a stacked structure as shown in FIG. 1. This is not a limitation of the present embodiments. The structure of the stacked layers 102~112 of the MTJ 100 may be reversal. The first ferromagnetic layer 104 is arranged to be a ferromagnetic free layer 114. The first spacer 106 is arranged to be a tunnel layer 116. The second ferromagnetic layer 108, the second spacer 110, and the third ferromagnetic layer 112 are arranged to be a ferromagnetic fixed layer 118.

According to some embodiments, the capping layer 102 may include non-ferromagnet metal or insulator. Such materials include, but are not limited to, silver (Ag), gold (Au), copper (Cu), tantalum (Ta), tantalum nitride (TaN), tungsten (W), manganese (Mn), platinum (Pt), palladium (Pd), vanadium (V), chromium (Cr), niobium (Nb), molybdenum (Mo), technetium (Tc), ruthenium (Ru), iridium (Ir), rhenium (Re), osmium (Os), aluminum oxide (Al2O3), magnesium oxide (MgO), tantalum oxide (TaO), ruthenium oxide (RuO) or the like.

According to some embodiments, each of the ferromagnetic layers 104, 108, and 112 may include ferromagnetic material, which may be metal or metal alloy, for example, Fe, Co, Ni, CoFeB, FeB, CoFe, FePt, FePd, CoPt, CoPd, CoNi, TbFeCo, CrNi or the like.

According to some embodiments, the first spacer 106 may include insulator, for example, $Al_2O_3$, MgO, TaO, RuO or the like.

According to some embodiments, the second spacer 110 may include non-ferromagnetic metal, for example, Ag, Au, Cu, Ta, W, Mn, Pt, Pd, V, Cr, Nb, Mo, Tc, Ru or the like.

The direction of the magnetic field or magnetization of the ferromagnetic fixed layer 118 is fixed while the direction of the magnetic field of the ferromagnetic free layer 114 is switchable. Moreover, the magnetic anisotropies of the ferromagnetic fixed layer 118 and the ferromagnetic free layer 114 may be in-plan magnetic anisotropy or perpendicular magnetic anisotropy. For the in-plan magnetic anisotropy, the magnetic orientation of the ferromagnetic fixed layer 118 (and the ferromagnetic free layer 114) is parallel to the surface of the ferromagnetic fixed layer 118. For the perpendicular magnetic anisotropy, the magnetic orientation of the ferromagnetic fixed layer 118 (and the ferromagnetic free layer 114) is perpendicular to the surface of the ferromagnetic fixed layer 118. The ferromagnetic fixed layer 118 and the ferromagnetic free layer 114 are electrically connected to a first control signal Sc1 and a second control signal Sc2, respectively. The first control signal Sc1 and the second control signal Sc2 may have a first voltage level and a second voltage level, respectively. The voltage drop between the first control signal Sc1 and the second control signal Sc2 may be controlled to have a positive voltage drop or a negative voltage drop depending on the writing operation or the reading operation of the magnetic tunneling junction 100. According to some embodiments, the voltage drop between the first control signal Sc1 and the second control signal Sc2 is a positive voltage drop when a data bit is to be written into the MTJ 100. The voltage drop between the first control signal Sc1 and the second control signal Sc2 is a negative voltage drop when a data bit stored in the MTJ 100 is to be read from the MTJ 100.

Figure 2:
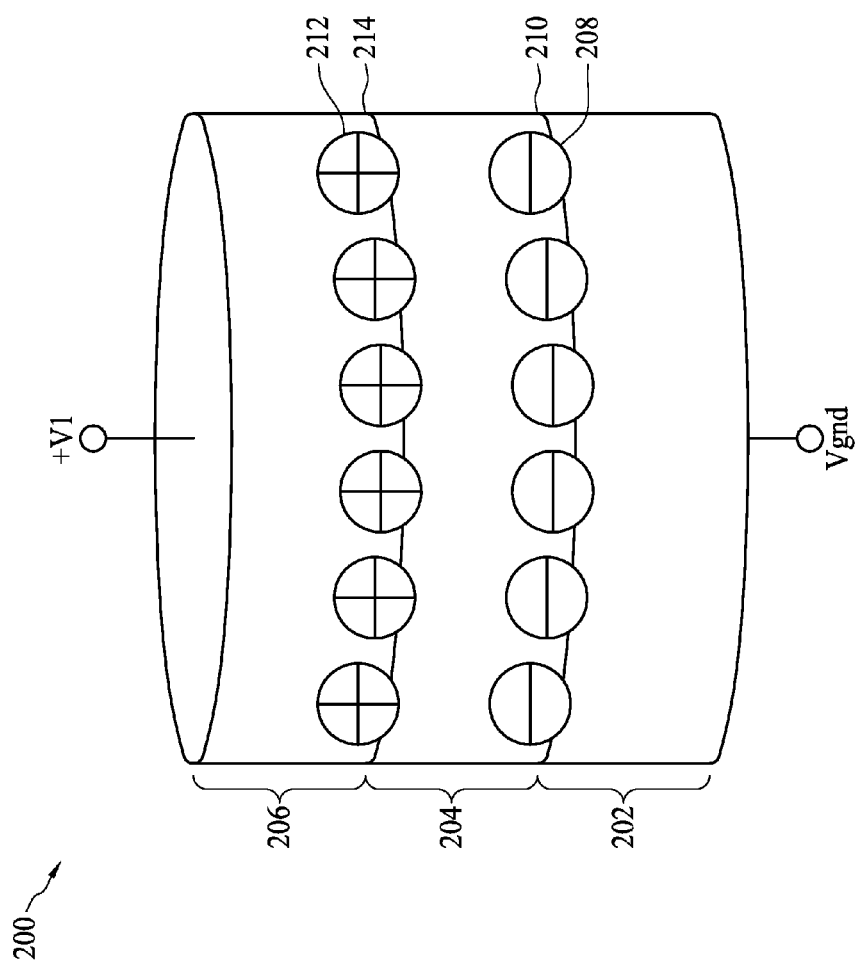
FIG. 2 is a diagram illustrating an MTJ according to some embodiments.

FIG. 2 is a diagram illustrating an MTJ 200 according to some embodiments. The MTJ 200 is a simplified MTJ in comparison to the MTJ 100. For simplicity, the MTJ 200 comprises a ferromagnetic free layer 202, a tunnel layer 204, and a ferromagnetic fixed layer 206. According to some embodiments, the ferromagnetic fixed layer 206 is electrically connected to a first control signal with a positive voltage level "+V1," and the ferromagnetic free layer 202 is electrically connected to a second control signal with a ground voltage Vgnd. For example, the positive voltage level +V1 may be 1V and the ground voltage Vgnd may be 0V. Therefore, the voltage drop between the ferromagnetic fixed layer 206 and the ferromagnetic free layer 202 is a positive voltage drop. When the voltage drop between the ferromagnetic fixed layer 206 and the ferromagnetic free layer 202 is positive, the negative charge 208 is accumulated on the interface 210 between the ferromagnetic free layer 202 and the tunnel layer 204 and the positive charge 212 is accumulated on the interface 214 between the ferromagnetic fixed layer 206 and the tunnel layer 204. The negative charge 208 on the interface 210 may affect the magnetic anisotropy of the ferromagnetic free layer 202. According to some embodiments, when the voltage drop between the ferromagnetic fixed layer 206 and the ferromagnetic free layer 202 increases, the negative charge 208 accumulated on the interface 210 also increases. Then, the negative charge 208 may change the magnetic anisotropy of the ferromagnetic free layer 202. When the magnetic anisotropy of the ferromagnetic free layer 202 is changed, the data bit of the MTJ 200 is also changed. In other words, by increasing the voltage drop between the ferromagnetic fixed layer 206 and the ferromagnetic free layer 202, a data bit can be written into the ferromagnetic free layer 202.

Figure 3:
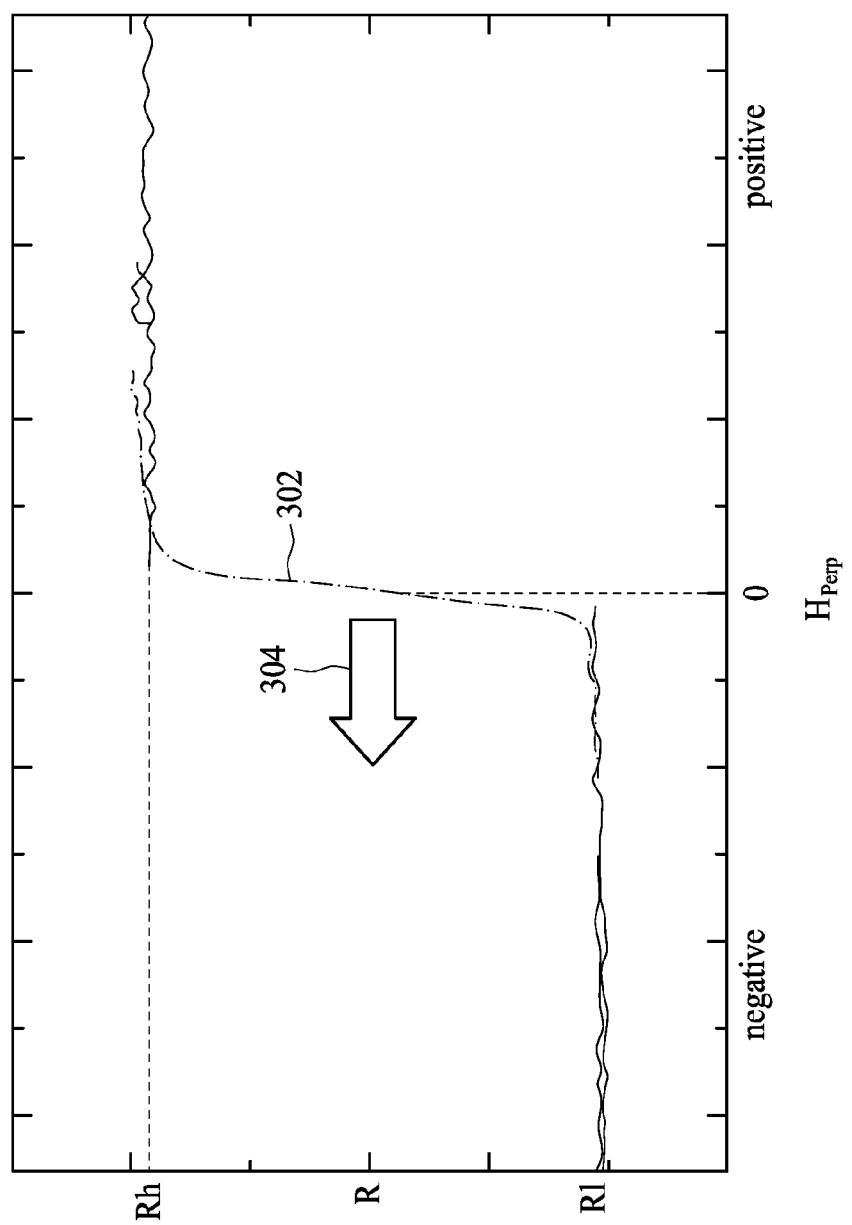
FIG. 3 is a diagram illustrating the variation of the magnetoresistance of an MTJ according to some embodiments.

FIG. 3 is a diagram illustrating the variation of the magnetoresistance of the MTJ 200 according to some embodiments. Curve 302 shows the variation of the magnetoresistance of the MTJ 200 when the ferromagnetic fixed layer 206 is electrically connected to 1V, and the ferromagnetic free layer 202 is electrically connected to 0V. X-axis represents the strength $H_{Perp}$ of the external magnetic field imposed on the MTJ 200. Y-axis represents the magnetoresistance R of the MTJ 200. The magnetoresistance R may be a normalized magnetoresistance of the MTJ 200. When the voltage drop from the ferromagnetic fixed layer 206 to the ferromagnetic free layer 202 is 1V, for example, the switching point of the curve 302 is substantially located at the zero magnetic field. In addition, the magnetoresistance R in respect to the strength $H_{Perp}$ of the external magnetic field (i.e. X-axis) may have a hysteresis phenomena. The hysteresis phenomena may cause the variation of the magnetoresistance R (i.e. the curve 302) to have a hysteresis loop. A switching field or a switching range of the magnetoresistance R may equal the width of the hysteresis loop. For example, when the strength $H_{Perp}$ of the external magnetic field imposed on the MTJ 200 is larger than the upper bound of the hysteresis loop, the magnetoresistance R is switched to the high resistance Rh from the low resistance Rl. When the strength $H_{Perp}$ of the external magnetic field imposed on the MTJ 200 is smaller than the lower bound of the hysteresis loop, the magnetoresistance R is switched to the low resistance Rl from the high resistance Rh. In addition, the switching field (i.e. the hysteresis loop) of the magnetoresistance R of the MTJ 200 is reduced by the positive voltage drop from the ferromagnetic fixed layer 206 to the ferromagnetic free layer 202. According to the embodiment of FIG. 3, the magnetoresistance R (i.e. the curve 302) is reduced to have no hysteresis loop by the positive voltage drop from the ferromagnetic fixed layer 206 to the ferromagnetic free layer 202. Accordingly, for the curve 302, when the strength $H_{Perp}$ of the external magnetic field imposed on the MTJ 200 is greater than 0, the magnetoresistance R of the MTJ 200 switches to the high resistance Rh. When the strength $H_{Perp}$ of the external magnetic field imposed on the MTJ 200 is smaller than 0, the magnetoresistance R of the MTJ 200 switches to the low resistance Rl. In other words, the switching field of the magnetoresistance R of the MTJ 200 is substantially zero in this embodiment.

In addition, when the voltage drop from the ferromagnetic fixed layer 206 to the ferromagnetic free layer 202 further increases to be higher than 1V, the curve 302 may shift to the left side of the X-axis as shown by the arrow 304 in FIG. 3. As a result, the magnetoresistance R of the MTJ 200 may also switch to the high resistance Rh from the low resistance Rl due to the voltage controlled magnetic anisotropy (VCMA) effect. As mentioned in the above paragraphs, the negative charge 208 accumulated on the interface 210 affects the magnetic anisotropy of the ferromagnetic free layer 202. When the negative charge 208 is further accumulated by the increasing voltage drop from the ferromagnetic fixed layer 206 to the ferromagnetic free layer 202, the negative charge 208 may change the direction of the magnetization of the ferromagnetic free layer 202 to one opposite to the direction of the magnetization of the ferromagnetic fixed layer 206. As a result, the magnetoresistance R of the MTJ 200 becomes the high resistance Rh.

Figure 4:
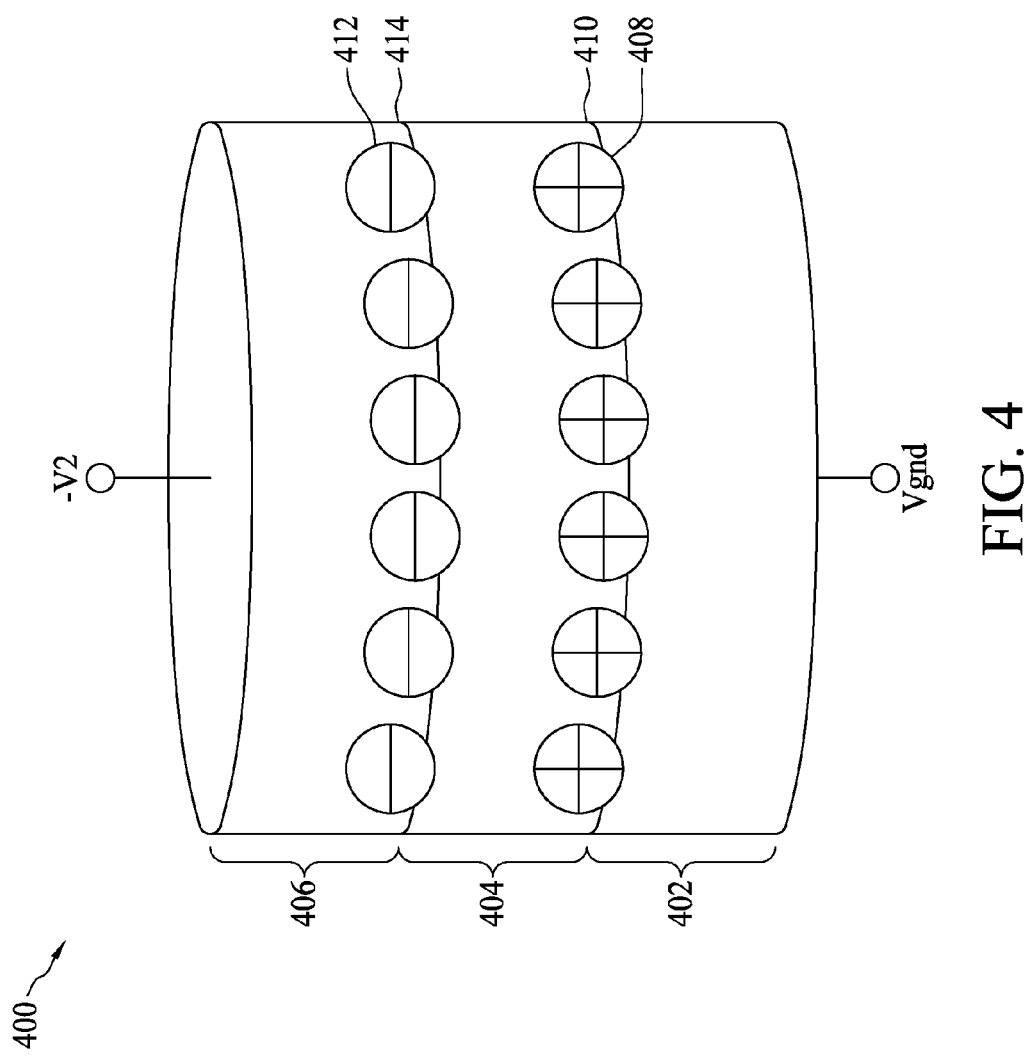
FIG. 4 is a diagram illustrating an MTJ according to some embodiments.

However, when the voltage drop from the ferromagnetic fixed layer 206 to the ferromagnetic free layer 202 decreases from the positive voltage drop to the negative voltage drop, the switching field of the magnetoresistance R of the MTJ 200 is increased. FIG. 4 is a diagram illustrating an MTJ 400 according to some embodiments. The MTJ 400 comprises a ferromagnetic free layer 402, a tunnel layer 404, and a ferromagnetic fixed layer 406. According to some embodiments, the ferromagnetic fixed layer 406 is electrically connected to a first control signal with a negative voltage level "−V2," and the ferromagnetic free layer 402 is electrically connected to a second control signal with a ground voltage Vgnd. For example, the negative voltage level −V2 may be −1V and the ground voltage Vgnd may be 0V. Therefore, the voltage drop between the ferromagnetic fixed layer 406 and the ferromagnetic free layer 402 is a negative voltage drop. When the voltage drop between the ferromagnetic fixed layer 406 and the ferromagnetic free layer 402 is negative, the positive charge 408 is accumulated on the interface 410 between the ferromagnetic free layer 402 and the tunnel layer 404, and the negative charge 412 is accumulated on the interface 414 between the ferromagnetic fixed layer 406 and the tunnel layer 404. According to some embodiments, the positive charge 408 on the interface 410 may not affect the magnetic anisotropy of the ferromagnetic free layer 402. Moreover, the negative voltage drop increases the switching field of the magnetoresistance R of the MTJ 400 as shown in FIG. 5.

Figure 5:
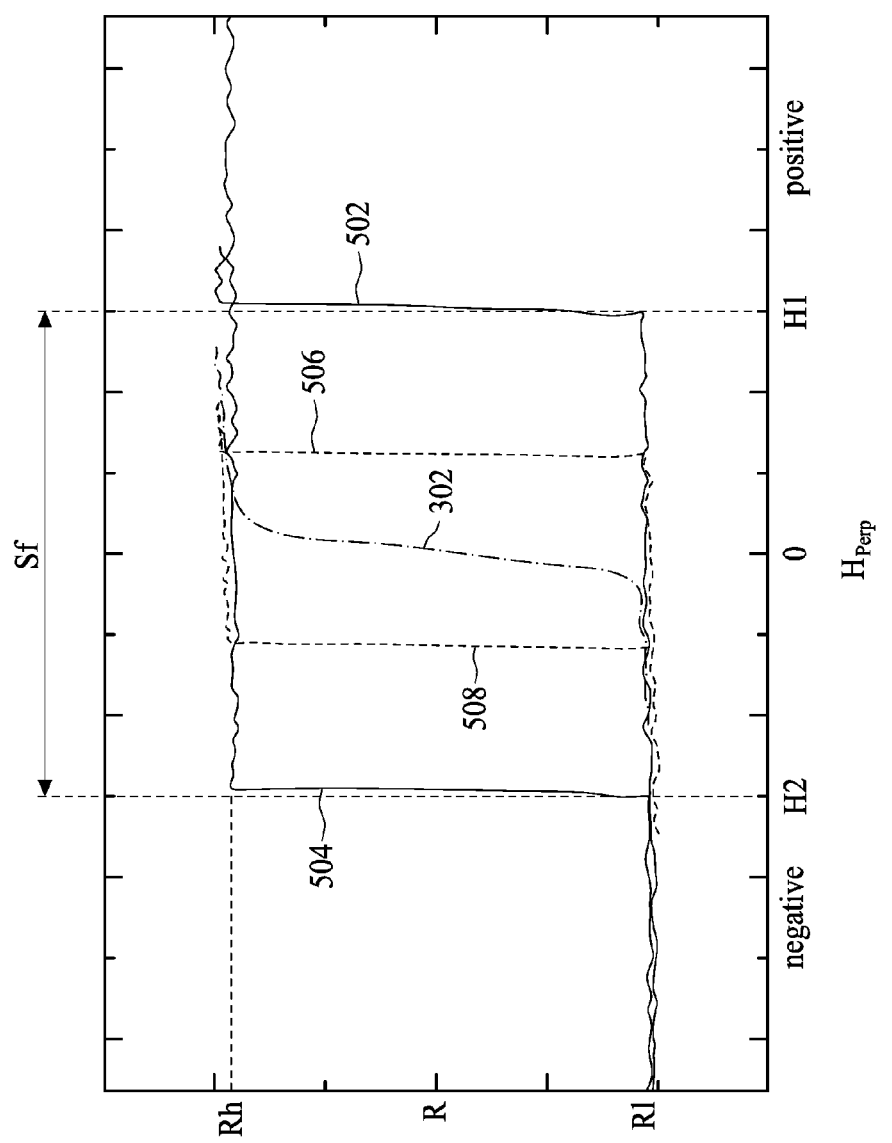
FIG. 5 is a diagram illustrating the variation of the magnetoresistance of an MTJ according to some embodiments.

FIG. 5 is a diagram illustrating the variation of the magnetoresistance of the MTJ 400 according to some embodiments. Curves 502 and 504 show the variation of the magnetoresistance of the MTJ 400 when the ferromagnetic fixed layer 406 is electrically connected to −1V, and the ferromagnetic free layer 402 is electrically connected to 0V. X-axis represents the strength $H_{Perp}$ of the external magnetic field imposed on the MTJ 400. Y-axis represents the magnetoresistance R of the MTJ 400. The magnetoresistance R may be a normalized magnetoresistance of the MTJ 400. According to some embodiments, the curve 502 shows the relation between the magnetoresistance R of the MTJ 400 and the strength $H_{Perp}$ of the external magnetic field imposed on the MTJ 400 when the magnetoresistance R is switched to the high resistance Rh from the low resistance Rl. The strength $H_{Perp}$ of the external magnetic field to switch the magnetoresistance R from the low resistance Rl to the high resistance Rh is substantially at the magnetic field which may be a positive magnetic field. The curve 504 shows the relation between the magnetoresistance R of the MTJ 400 and the strength $H_{Perp}$ of the external magnetic field imposed on the MTJ 400 when the magnetoresistance R is switched to the low resistance Rl from the high resistance Rh. The strength $H_{Perp}$ of the external magnetic field to switch the magnetoresistance R from the high resistance Rh to the low resistance Rl is substantially at the magnetic field H2, which may be a negative magnetic field. Accordingly, the hysteresis formed by the curves 502 and 504 may be regarded as the switching field Sf of the magnetoresistance R of the MTJ 400. For the purpose of discussion, curves 302, 506, and 508 are also shown in FIG. 5. The curves 506 and 508 show the variation of the magnetoresistance of the MTJ 400 when the voltage drop between the ferromagnetic fixed layer 406 and the ferromagnetic free layer 402 is 0V, e.g., given that both of the ferromagnetic fixed layer 406 and the ferromagnetic free layer 402 are electrically connected to the ground voltage Vgnd.

According to some embodiments, when the switching field Sf of the magnetoresistance R of the MTJ 400 is increased by the negative voltage drop from the ferromagnetic fixed layer 406 and the ferromagnetic free layer 402, the strength $H_{Perp}$ of external magnetic field applied for switching the MTJ 400 is larger. In other words, the state of the ferromagnetic free layer 402 is more stable when the negative voltage drop is applied from the ferromagnetic fixed layer 406 and the ferromagnetic free layer 402. Therefore, the MTJ 400 may have a relatively large read window when the negative voltage drop is applied from the ferromagnetic fixed layer 406 and the ferromagnetic free layer 402 during a reading operation.

Accordingly, to have a relatively large read window of an MTJ, a negative voltage drop is applied from the ferromagnetic fixed layer 406 and the ferromagnetic free layer 402 during a reading operation. In addition, a positive voltage drop is applied from the ferromagnetic fixed layer 406 and the ferromagnetic free layer 402 during a writing operation.

Figure 6:
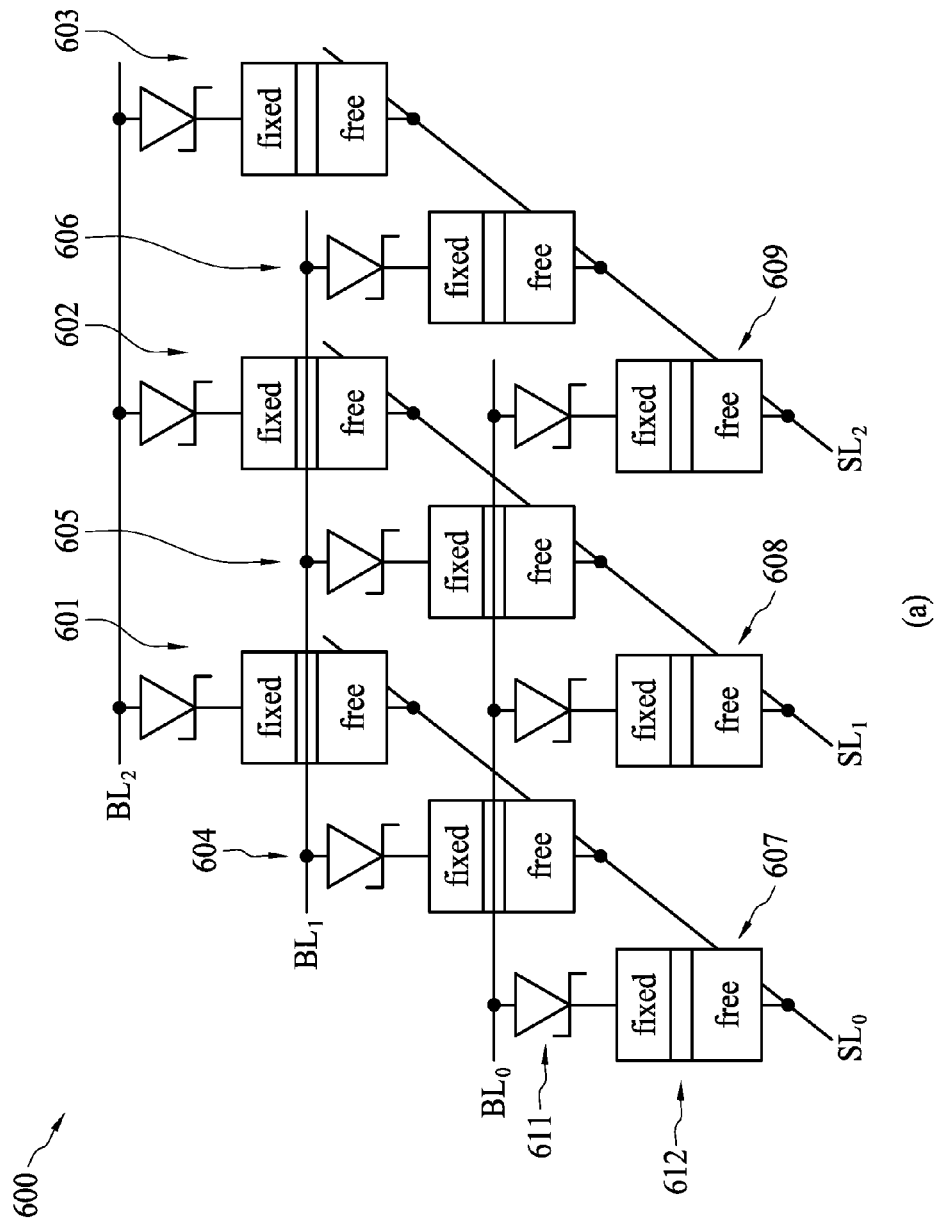
FIG. 6 is a diagram illustrating a magnetoresistive random access memory array according to some embodiments.

FIG. 6 is a diagram illustrating a magnetoresistive random access memory (MRAM) array 600 according to some embodiments. The MRAM array 600 comprises a plurality of magnetic memory cell 601~609. Each magnetic memory cell comprises a gating transistor (e.g., 611) and an MTJ (e.g., 612). The gate terminal of the gating transistor 611 is electrically connected to a word line (not shown) of the MRAM array 600. The drain terminal of the gating transistor 611 is electrically connected to a bit line BL of the MRAM array 600. The source terminal of the gating transistor 611 is electrically connected to a ferromagnetic fixed layer of the MTJ 612. The ferromagnetic free layer of the MTJ 612 is electrically connected to a source select line SL of the MRAM array 600. A sensing amplifier (not shown) may be connected to the source select line SL and/or bitline BL for sensing a current flowing through the MTJ 612. For brevity, the gating transistor 611 is equivalent to a zener diode as shown in FIG. 6. According to some embodiments, when a magnetic memory cell is to be accessed, the bit line, the source select line, and the word line corresponding to the magnetic memory cell are activated. For example, when the magnetic memory cell 607 is to be read, the word line is charged to the high voltage level to turn on the gating transistor 611, and the voltage drop from the bit line $BL_0$ to the source select line $SL_0$ is controlled to be a negative voltage drop for inducing a current to flow from the source select line $SL_0$ to the bit line $BL_0$. When the magnetic memory cell 607 is to be written, the word line is charged to the high voltage level to turn on the gating transistor 611, and the voltage drop from the bit line $BL_0$ to the source select line $SL_0$ is controlled to be a positive voltage drop for inducing a current to flow from the bit line $BL_0$ to the source select lute $SL_0$.

Figure 7:
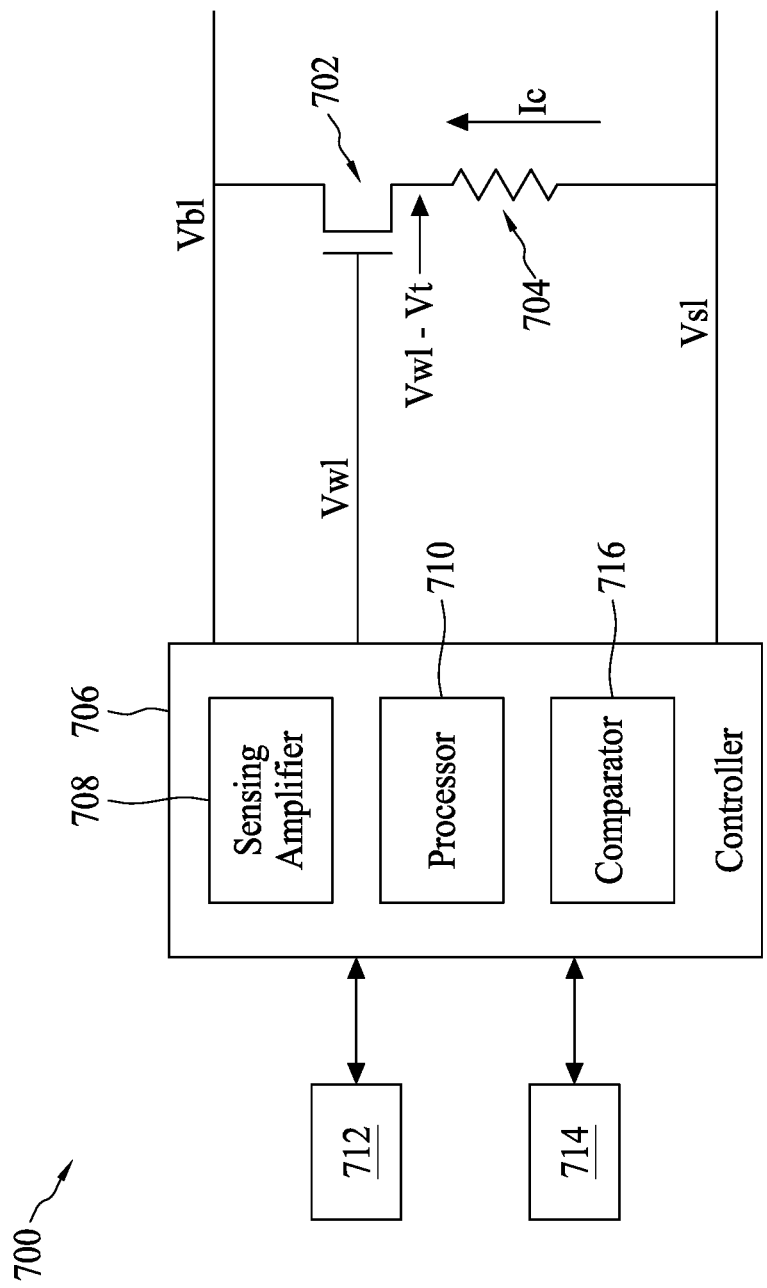
FIG. 7 is a diagram illustrating a magnetic memory cell according to some embodiments.

FIG. 7 is a diagram illustrating a magnetic memory cell 700 according to some embodiments. The magnetic memory cell 700 may be a magnetic memory cell of the MRAM array 600. The magnetic memory cell 700 comprises a gating transistor 702 and an MTJ 704. The gate terminal of the gating transistor 702 is electrically connected to a word line signal Vwl. The drain terminal of the gating transistor 702 is electrically connected to a bit line signal Vbl. The source terminal of the gating transistor 702 is electrically connected to a ferromagnetic fixed layer of the MTJ 704. The ferromagnetic free layer of the MTJ 704 is electrically connected to a source select line signal Vsl. For brevity, the MTJ 704 is equivalent to a resistor as shown in FIG. 7. During the reading operation of the magnetic memory cell 700, the word line signal Vwl may be a relatively high voltage level to turn on the gating transistor 702. The bit line signal Vbl may be a supply voltage Vdd. The source select line signal Vsl has a voltage level higher than the supply voltage Vdd. A controller 706 may be used to control the word line signal Vwl, the bit line signal Vbl, and the source select line signal Vsl.

Accordingly, during a reading operation of the magnetic memory cell 700, a current Ic flows through the MTJ 704. As the current Ic is designed to flow from the source terminal to the drain terminal of the gating transistor 702, the gating transistor 702 may experience a high source loading effect. The voltage level of the source terminal of the gating transistor 702 is Vwl−Vt, wherein Vt is the threshold voltage of the gating transistor 702. The high source loading effect may greatly reduce the current Ic. When the current Ic is reduced, the write window of the MTJ 704 is also reduced due to the spin torque transfer (STT) effect. Therefore, the read window of the MTJ 704 is increased. When the read window is increased, the magnetization of the ferromagnetic free layer in the MTJ 704 becomes more stable. The reason has been described in the above FIG. 5 and the related paragraphs, thus the detailed description is omitted here for brevity.

A sensing amplifier 708 may be used to determine the magnitude of the current Ic. The magnitude of the current Ic is dependent on the resistance of the MTJ 704. Accordingly, the magnetization direction of the ferromagnetic free layer in the MTJ 704 can be determined in accordance with the magnitude of the current Ic. For example, when the current Ic is smaller than a reference current, this may indicate that the resistance of the MTJ 704 is relatively large. Then, the magnetization direction of the ferromagnetic free layer is determined to be one opposite to the magnetization direction of the ferromagnetic fixed layer. The data bit corresponding to the large resistance of the MTJ 704 may be the bit "0". On the other hand, when the current Ic is larger than the reference current, this may indicate that the resistance of the MTJ 704 is relatively small. Then, the magnetization direction of the ferromagnetic free layer is determined to be one similar to the magnetization direction of the ferromagnetic fixed layer. The data bit corresponding to the small resistance of the MTJ 704 may be the bit "1". A processor 710 may be used to determine a logical state of the data bit of the magnetic memory cell 700 according to the magnitude of the current Ic.

According to some embodiments, the sensing amplifier 708 and the processor 710 are integrated into the controller 706. However, this is not a limitation of the embodiments. The sensing amplifier 708, the processor 710, and the controller 706 may be implemented as physically separated devices.

Figure 8:
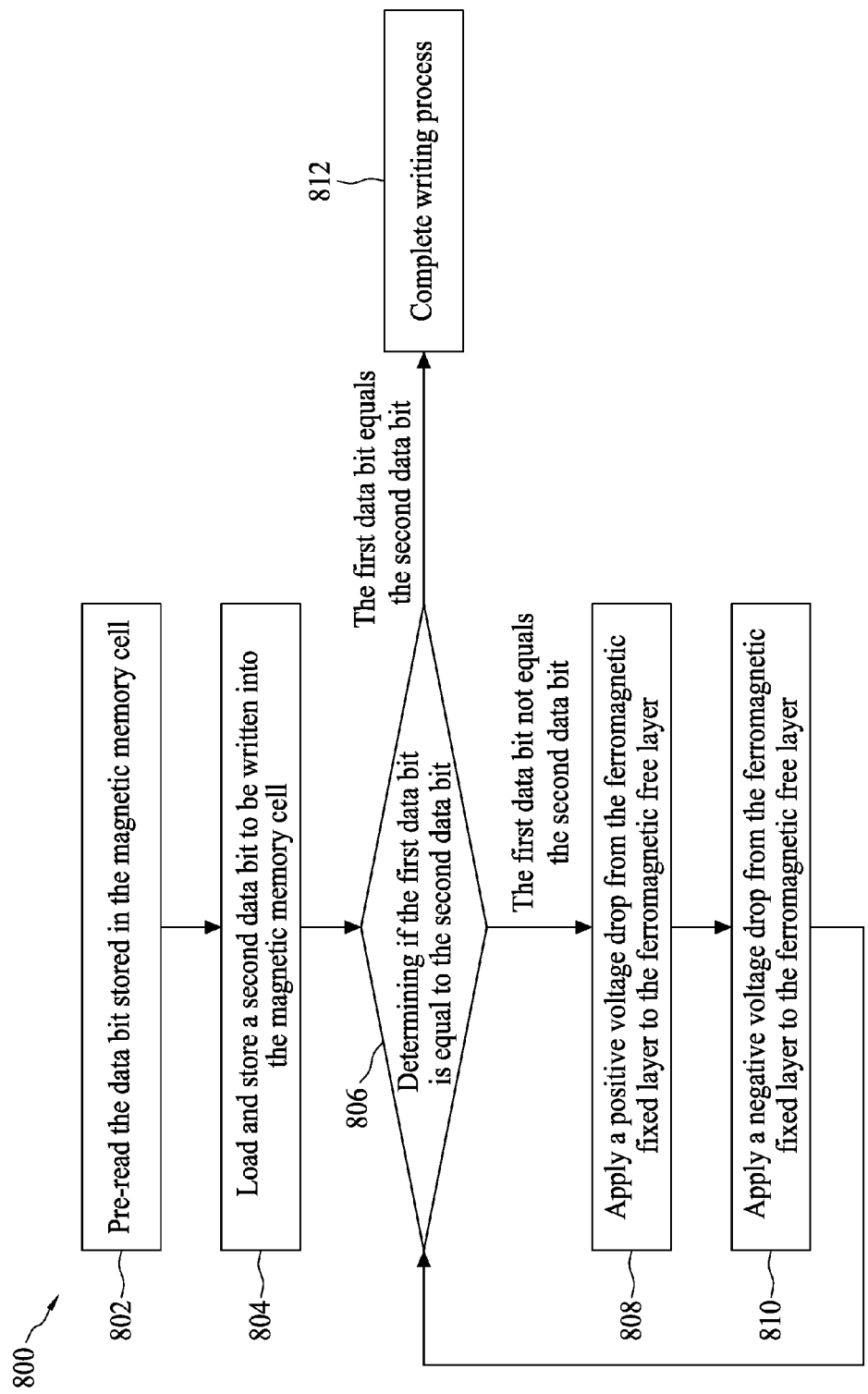
FIG. 8 is a flowchart illustrating a writing process of the magnetic memory cell illustrated in FIG. 7 according to some embodiments.

FIG. 8 is a flowchart illustrating a writing process 800 of the magnetic memory cell 700 according to some embodiments. The writing process 800 comprises operations 802~810. In operation 802, the data bit stored in the magnetic memory cell 700 is pre-read. A first data bit of the magnetic memory cell 700 is read and stored in a first storage device 712. The first storage device 712 may include a latch. The reading operation is performed by applying a negative voltage drop from the ferromagnetic fixed layer to the ferromagnetic free layer of the magnetic memory cell 700 as described in the above paragraphs. The controller 706 may be used to apply the negative voltage drop from the ferromagnetic fixed layer to the ferromagnetic free layer of the magnetic memory cell 700.

In operation 804, a second data bit to be written into the magnetic memory cell 700 is loaded and stored into a second storage device 714. The second storage device 714 may include a latch.

In operation 806, the first data bit is compared with the second data bit. If the comparison result shows the first data bit is equal to the second data bit, this indicates that data bit stored in the magnetic memory cell 700 is the second data bit. Then, the writing process 800 is completed in operation 812. If the comparison result shows the first data bit is different from the second data bit, this indicates that data bit stored in the magnetic memory cell 700 is not the second data bit. Then, the process goes to operation 808. According to some embodiments, a comparator 716 may be applied to compare the first data bit and the second data bit and generate the comparison result accordingly. The processor 710 may be used to determine if the data bit is written into the magnetic memory cell 700 according to the comparison result.

In operation 808, the second data bit is written into the magnetic memory cell 700 by applying a positive voltage drop from the ferromagnetic fixed layer to the ferromagnetic free layer of the magnetic memory cell 700. When the positive voltage drop is applied from the ferromagnetic fixed layer to the ferromagnetic free layer of the magnetic memory cell 700, a current flows from the ferromagnetic fixed layer to the ferromagnetic free layer. Then, the second data bit may be written into the magnetic memory cell 700 as described in the above paragraphs. The controller 706 may be used to apply the positive voltage drop from the ferromagnetic fixed layer to the ferromagnetic free layer of the magnetic memory cell 700.

In operation 810, the data bit stored in the magnetic memory cell 700 is read. A third data bit of the magnetic memory cell 700 is read and stored in the first storage device. The reading operation is performed by applying a negative voltage drop from the ferromagnetic fixed layer to the ferromagnetic free layer of the magnetic memory cell 700 as described in the above paragraphs. Then, the process goes to the operation 806 for determining if the third data bit is equal to the second data bit. The controller 706 may be used to apply the negative voltage drop from the ferromagnetic fixed layer to the ferromagnetic free layer of the magnetic memory cell 700.

In operation 806, the third data bit is compared with the second data bit. If the comparison result shows the first data bit is equal to the second data bit, this indicates that second data bit has been written into the magnetic memory cell 700. Then, the writing process 800 is completed. If the comparison result shows the third data bit is different from the second data bit, this indicates that data bit stored in the magnetic memory cell 700 is not the second data bit. Then, the process repeats the operations 808, 810, and 806 until the second data bit is written into the magnetic memory cell 700. The processor 710 may be used to determine if the third data bit is written into the magnetic memory cell 700.

Briefly, in some embodiments, the present magnetic tunneling junction is configured to be read and written by different polarities of voltage drop (or different directions of current flow) respectively. When a negative voltage drop is applied from the ferromagnetic fixed layer to the ferromagnetic free layer of a magnetic memory cell during the reading operation, the read window of the magnetic tunneling junction is relatively large. When the read window is large, the data bit stored in the MTJ is more stable. Then, during the reading operation, the logical state of the data bit may not be affected by the VCMA effect. Therefore, the read disturb caused by the VCMA effect can be solved. In addition, when a positive voltage drop is applied from the ferromagnetic fixed layer and the ferromagnetic free layer of a magnetic memory cell during the writing operation, the data bit can be written into the magnetic memory cell by the VCMA effect.

Some embodiments of the present disclosure provide a method for controlling a magnetic memory device. The method comprises: applying a first control signal and a second control signal to a ferromagnetic fixed layer and a ferromagnetic free layer of the magnetic memory device respectively, wherein a first voltage level of the first control signal is lower than a second voltage level of the second control signal; sensing a first current signal flowing through the magnetic memory device; and determining a logical state of a first data bit according to the first current signal.

Some embodiments of the present disclosure provide a method for controlling a magnetic memory device. The method comprises: applying a first control signal and a second control signal to a ferromagnetic fixed layer and a ferromagnetic free layer of the magnetic memory device, respectively, to read a first data bit from the magnetic memory device, wherein a first voltage level of the first control signal is lower than a second voltage level of the second control signal; comparing the first data bit and a second data bit to generate a first comparison result; and when the first comparison result indicates the first data bit is different from the second data bit, applying a third control signal and a fourth control signal to the ferromagnetic fixed layer and the ferromagnetic free layer of the magnetic memory device, respectively, to write the second data bit into the magnetic memory device, wherein a third voltage level of the third control signal is higher than a fourth voltage level of the fourth control signal.

Some embodiments of the present disclosure provide a magnetic memory device. The magnetic memory device comprises a ferromagnetic free layer, a tunnel layer, a ferromagnetic fixed layer, a transistor, a controller, and a processor. The tunnel layer is disposed on the ferromagnetic free layer. The ferromagnetic fixed layer is disposed on the tunnel layer. The transistor has a first connecting terminal coupled to the ferromagnetic fixed layer. The controller is arranged to apply a first control signal and a second control signal to a second connecting terminal of the transistor and the ferromagnetic free layer of the magnetic memory device, respectively, wherein a first voltage level of the first control signal is lower than a second voltage level of the second control signal. The processor is arranged to determine a logical state of a first data bit according to a first current signal of the magnetic memory device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for controlling a magnetic memory device, the method comprising:
    applying a first control signal and a second control signal to a ferromagnetic fixed layer and a ferromagnetic free layer of the magnetic memory device respectively, wherein a first voltage level of the first control signal is lower than a second voltage level of the second control signal;
    sensing a first current signal flowing through the magnetic memory device;
    determining a logical state of a first data bit according to the first current signal;
    storing the first data bit into a first storage device;
    storing a second data bit into a second storage device;
    comparing the first data bit and the second data bit to generate a first comparison result; and
    when the first comparison result indicates that the first data bit is different from the second data bit, applying a third control signal and a fourth control signal to the ferromagnetic fixed layer and the ferromagnetic free layer of the magnetic memory device respectively, wherein a third voltage level of the third control signal is higher than a fourth voltage level of the fourth control signal.

2. The method of claim 1, wherein the second data bit is written into the magnetic memory device when the first comparison result indicates that the first data bit is equal to the second data bit.

3. The method of claim 1, further comprising:
    applying a fifth control signal and a sixth control signal to the ferromagnetic fixed layer and the ferromagnetic free layer of the magnetic memory device respectively;
    sensing a second current signal of the magnetic memory device;
    determining the logical state of a third data bit according to the second current signal; and
    comparing the third data bit and the second data bit to generate a second comparison result.

4. The method of claim 3, wherein a fifth voltage level of the fifth control signal is lower than a sixth voltage level of the sixth control signal.

5. The method of claim 3, further comprising:
    storing the third data bit into the first storage device.

6. The method of claim 3, wherein the second data bit is written into the magnetic memory device when the second comparison result indicates that the third data bit is equal to the second data bit.

7. The method of claim 3, further comprising:
    when the second comparison result indicates that the third data bit is different from the second data bit, applying the third control signal and the fourth control signal to the ferromagnetic fixed layer and the ferromagnetic free layer of the magnetic memory device respectively.

8. A method for controlling a magnetic memory device, the method comprising:
    applying a first control signal and a second control signal to a ferromagnetic fixed layer and a ferromagnetic free layer of the magnetic memory device, respectively, to read a first data bit from the magnetic memory device, wherein a first voltage level of the first control signal is lower than a second voltage level of the second control signal;
    comparing the first data bit and a second data bit to generate a first comparison result; and
    when the first comparison result indicates the first data bit is different from the second data bit, applying a third control signal and a fourth control signal to the ferromagnetic fixed layer and the ferromagnetic free layer of the magnetic memory device, respectively, to write the second data bit into the magnetic memory device, wherein a third voltage level of the third control signal is higher than a fourth voltage level of the fourth control signal.

9. The method of claim 8, wherein the second data bit is written into the magnetic memory device when the second comparison result indicates that the third data bit is equal to the second data bit.

10. The method of claim 8, further comprising:
    after applying the third control signal and the fourth control signal to the ferromagnetic fixed layer and the ferromagnetic free layer of the magnetic memory device, respectively, applying the first control signal and the second control signal to the ferromagnetic fixed layer and the ferromagnetic free layer of the magnetic memory device, respectively, to read a third data bit from the magnetic memory device; and
    comparing the third data bit and the second data bit to generate a second comparison result;
    wherein the second data bit is written into the magnetic memory device when the second comparison result indicates the third data bit is equal to the second data bit.

11. The method of claim 10, wherein when the second comparison result indicates that the third data bit is different from the second data bit, applying the third control signal and the fourth control signal to the ferromagnetic fixed layer and the ferromagnetic free layer of the magnetic memory device, respectively, to write the second data bit into the magnetic memory device.

12. A magnetic memory device, comprising:
    a ferromagnetic free layer;

a tunnel layer, disposed on the ferromagnetic free layer;
a ferromagnetic fixed layer, disposed on the tunnel layer;
a transistor, having a first connecting terminal coupled to the ferromagnetic fixed layer;
a controller, arranged to apply a first control signal and a second control signal to a second connecting terminal of the transistor and the ferromagnetic free layer of the magnetic memory device respectively, wherein a first voltage level of the first control signal is lower than a second voltage level of the second control signal;
a processor, arranged to determine a logical state of a first data bit according to a first current signal of the magnetic memory device;
a first storage device, arranged to store the first data bit;
a second storage device, arranged to store a second data bit; and
a comparator, arranged to compare the first data bit and the second data bit to generate a first comparison result;
wherein when the first comparison result indicates that the first data bit is different from the second data bit, the controller further applies a third control signal and a fourth control signal to the ferromagnetic fixed layer and the ferromagnetic free layer of the magnetic memory device respectively, and a third voltage level of the third control signal is higher than a fourth voltage level of the fourth control signal.

13. The magnetic memory device of claim 12, wherein the second data bit is written into the magnetic memory device when the first comparison result indicates that the first data bit is equal to the second data bit.

14. The magnetic memory device of claim 12, wherein the controller further applies the first control signal and the second control signal to the ferromagnetic fixed layer and the ferromagnetic free layer of the magnetic memory device respectively; the processor further determines the logical state of a third data bit according to a second current signal of the magnetic memory device; the comparator further compares the third data bit and the second data bit to generate a second comparison result.

15. The magnetic memory device of claim 14, wherein the second data bit is written into the magnetic memory device when the second comparison result indicates that the third data bit is equal to the second data bit.

16. The magnetic memory device of claim 15, wherein when the second comparison result indicates that the third data bit is different from the second data bit, the controller further applies the third control signal and the fourth control signal to the ferromagnetic fixed layer and the ferromagnetic free layer of the magnetic memory device respectively.

17. The magnetic memory device of claim 12, further comprising:
a sensing amplifier, coupled to the transistor, arranged to determine a magnitude of the first current.

18. The magnetic memory device of claim 17, wherein the magnitude of the first current is depended on a magnetization direction of the ferromagnetic free layer.

19. The magnetic memory device of claim 12, wherein the first current flows from the first connecting terminal to the second connecting terminal of the transistor.

20. The magnetic memory device of claim 12, wherein the processor determines the first data according to the first current when the first voltage level at the second connecting terminal of the transistor is lower than the second voltage level at the ferromagnetic free layer.

* * * * *